United States Patent

[11] 3,588,176

[72] Inventors Thomas M. Byrne
Wappingers Falls;
Arkady Leoff, Poughkeepsie, both of N.Y.

[21] Appl. No. 775,457
[22] Filed Nov. 13, 1968
[45] Patented June 28, 1971
[73] Assignee International Business Machines Corporation
Armonk, N.Y.

[54] ARTICLE TRANSPORT SYSTEM AND METHOD
15 Claims, 5 Drawing Figs.

[52] U.S. Cl. ........ 302/2, 302/35, 302/29
[51] Int. Cl. ........ B65g 53/04, B65g 53/00
[50] Field of Search ........ 302/29, 31, 2; 243/2

[56] References Cited
UNITED STATES PATENTS

| | | | |
|---|---|---|---|
| 1,051,905 | 2/1913 | McCord | 302/29X |
| 1,971,853 | 3/1934 | Ihlefeldt | 302/31X |
| 3,253,865 | 5/1966 | Kanics | 302/29 |
| 3,408,113 | 10/1968 | Bouladon | 302/29X |

*Primary Examiner*—Evon C. Blunk
*Assistant Examiner*—Douglas D. Watts
*Attorneys*—Hanifin and Clark and Frank C. Leach, Jr.

ABSTRACT: An article is transported through an enclosed duct by being advanced sequentially from one to another of a plurality of stations. The article is suspended within the duct by an air film in the duct. The article is advanced from one station to the next adjacent station by producing a pressure differential between the two stations. To prevent overtravel of the article beyond the next adjacent station to which it is advanced, a vacuum brake may be utilized adjacent each of the stations.

ARTICLE TRANSPORT SYSTEM AND METHOD

In the automatic production of many small and similar-shaped articles such as semiconductor wafers in which electronic modular circuits are formed, for example, it is desirable to be able to transport the wafers from one work station to another as rapidly as possible. Furthermore, transporting these wafers, it is necessary that the wafers not contact each other or the structure through which they are transported. Otherwise, the wafers may be damaged. Therefore, in transporting semiconductor wafers, for example, it is necessary that the transporting be rapid but without any contact or intermingling of the wafers with each other or with the structure in which they are transported.

The present invention satisfactorily solves the foregoing problem by providing a method and system in which the semiconductor wafers may be transported through an enclosed duct without any contact with the enclosed duct or any intermingling of the wafers. The present invention also is capable of transporting the wafers at a relatively rapid speed and/or output so that the production of integrated circuits utilizing the semiconductor wafers may be maintained at a relatively high rate.

An object of this invention is to provide a method and apparatus for transporting articles over any distance.

Another object of this invention is to provide a transport system in which the transported articles are maintained in spaced relation to each other during movement by the transport system.

A further object of the invention is to provide a transporting apparatus in which movement of the transported articles is controlled as the article is advanced from one station to the next adjacent station.

Still another object of the invention is to provide noncontact handling of articles in a transporting apparatus.

The foregoing and other objects, features, and advantages of the invention will be more apparent from the following more particular description of the preferred embodiment of the invention as illustrated in the accompanying drawings. In the drawings.

Figures 1, 2, 3:
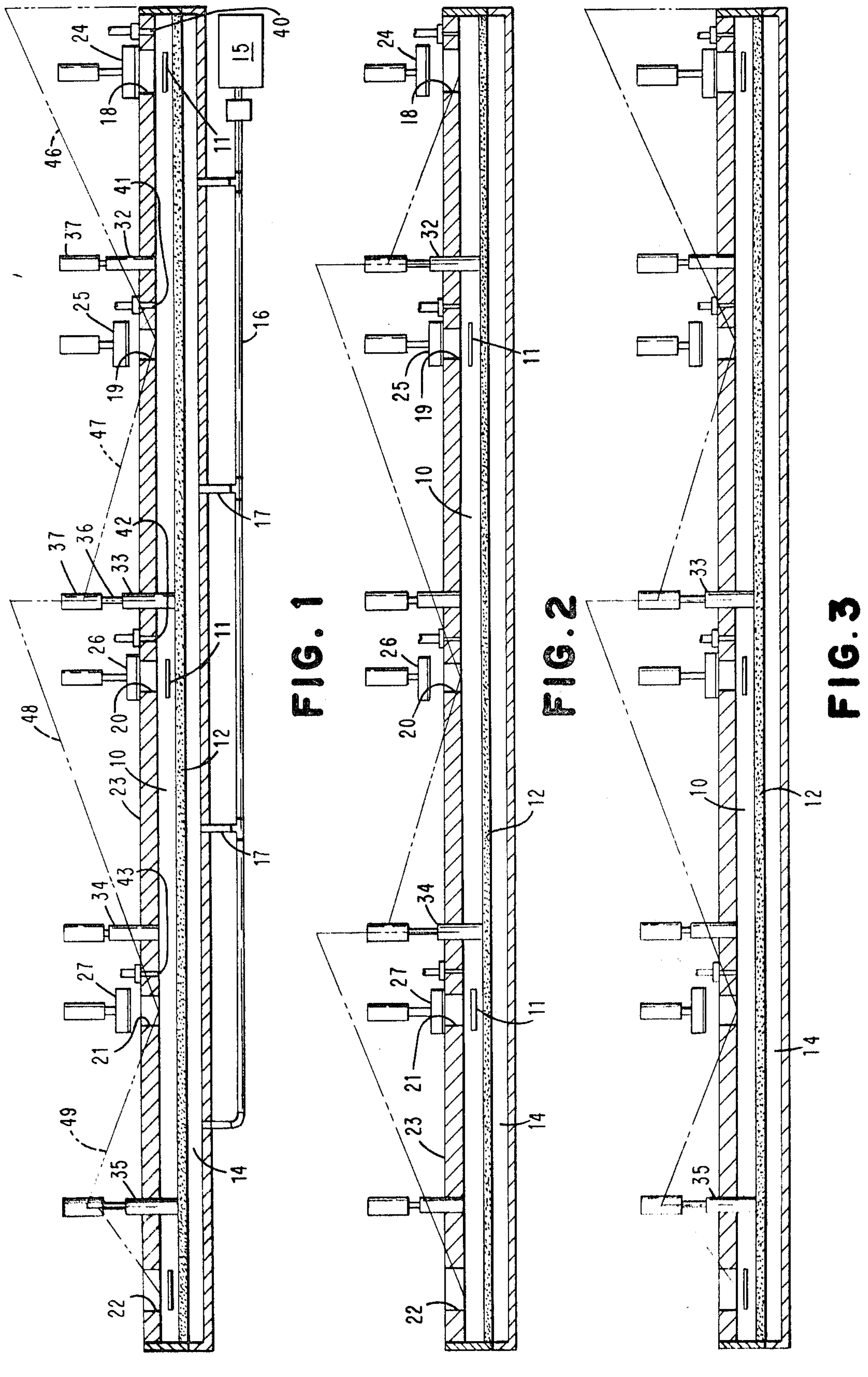
FIG. 1 is a schematic side sectional view of a portion of the transport system of the present invention.
FIG. 2 is a schematic side sectional view, similar to FIG. 1, but showing the wafer advanced from a first station to a second station that is next adjacent to the first station.
FIG. 3 is a schematic side sectional view, similar to FIGS. 1 and 2, but showing the wafer advanced from the second station to a third station that is next adjacent to the second station.

Referring to the drawings, there is shown a duct 10 through which articles 11 such as semiconductor wafers, for example, may be transported. The duct 10 has its bottom wall 12 formed of a porous material such as a sintered stainless steel porous member, for example. A gas, such as air, for example, may flow into the duct 10 from a manifold 14 through the porous bottom wall 12.

The manifold 14 has air supplied thereto from a pressurized source 15 by a main conduit 16 and branch conduits 17. The flow of air from the source 15 has sufficient pressure to produce an air film within the duct 10 so that the articles 11 may float thereon in suspended relation within the duct 10.

The duct 10 has a plurality of openings 18–22 in its upper wall 23 with each of the openings 18–22 being longitudinally spaced the same distance from each other. Each of the openings 18–22 defines a station to which each of the articles 11 is advanced in sequence. That is, the articles 11 are initially advanced from the opening 18, which forms a station, to the opening 19, which forms an adjacent station to the station at the opening 18, during one sequence of movement of the article 11. Then, the article 11 is advanced from the station, which is defined by the opening 20.

The openings 18–21 have valves 24–27, respectively, cooperating therewith to open or close the openings 18–21 depending upon the position of the articles 11 within the duct 10. Each of the valves 24–27 has a foam rubber gasket on its bottom surface to seal the opening with which is cooperates when the valve closes the opening.

Each of the valves 24–27 has a rod 29 of an air cylinder 30 connected thereto. The rod 29 is attached to a piston, which is movable in the air cylinder in response to the supply of air to the air cylinder 30. When air is supplied to the upper end of the air cylinder 30 from a source 30′ (see FIG. 4) through a hose 31, the valve is moved into a position to close the opening with which it cooperates. When the air is withdrawn from the upper end of the air cylinder 30 through the hose 31, the valve is moved to the opening position by a return spring (not shown).

The movement of the valves 24–27 is controlled by single means such as a solenoid valve 31′, for example. Alternate of the valves 24–27 will be in either a closed or open position at the same time. Thus, the solenoid valve 31′ could allow the supply of air to the air cylinders 30 for one group of the valves during advancement of the article 11 from a first station to a second station, which is next adjacent to the first station, and then allow the flow of air to the air cylinders 30 of the other group of the valves during the advancement of the articles 11 from the second station to third station, which is next adjacent to the second station. This type of alternate opening and closing of the valves 24–27 results in progressive sequential movement of the article 11 through the duct 10.

The duct 10 has a plurality of gates 32–35 supported thereby. Each of the gates 32–35 is movable into and out of positions to block the duct 10. The gates 32–35 are disposed between each adjacent pair of the openings 18–22 and adjacent the openings 19–22, respectively, as shown in FIG. 1. Thus, one of the gates is disposed adjacent each of the openings except the opening 18, which is adjacent the inlet of the duct 10 into which the article 11 is initially positioned. Since the inlet end of the duct 10 is closed or blocked, this functions as a permanent blocking gate for the duct 10.

Each of the gates 32–35 is attached to a rod 36 of an air cylinder 37. When air is supplied to the air cylinder 37 through an upper hose 38 (see FIG. 4) and retracted from the air cylinder through a lower hose 39, the gate is moved into a blocking position within the duct 10 due to the air acting on a piston, which is attached to the rod 36, to move the piston downwardly within the air cylinder 37. When air is supplied to the air cylinder 37 through the lower hose 39 and removed from the air cylinder 37 through the upper hose 38, the gate is moved upwardly since the piston within the air cylinder 37 is moved upwardly.

The flow of air to the air cylinders 37 through the hoses 38 and 39 also is controlled by the solenoid valve 31′. Since the hoses 38 communicates with the hoses 31, the gates 32 and 34 are moved downwardly when the adjacent valves 25 and 27, respectively, are moved downwardly to a closed position while the gates 33 and 35 are moved downwardly when the valves 26 and 24 are moved downwardly to a closed position. Accordingly, alternates of the gates 32–35 are in a blocking position while the other alternates of the are in a nonblocking position. The positioning of the gates in a blocking position results in the duct 10 being divided into segments.

The duct 10 has a plurality of openings 40–43 communicating therewith is longitudinally spaced relation to each other. The opening 40 is disposed adjacent the opening 18 between the opening 18 and the blocked inlet end of the duct 10, the opening 41 is disposed between the gate 32 and the opening 19, the opening 42 is positioned between the opening 20 and the gate 33, and the opening 43 is disposed between the opening 21 and the gate 34.

Air under pressure is supplied to each of the openings 40–43 from a source 45 (see FIG. 4) of pressurized air. The source 45 is different then the source 15 of air for producing the air film within the duct 10.

The air to the openings 40–43 is supplied from the source 45 only when the valve adjacent thereto is closed. The flow of the air to the openings 40–43 is controlled by suitable means such as a solenoid valve 44. The valve 44 allows air to flow from the source 45 to the openings 40 and 42 when the valves 24 and 26 are closed and to the openings 41 and 43 when the valves 25 and 27 are closed.

Considering the operation of the present invention with one of the articles 11 having been introduced into the duct 10 through the opening 18 by a suitable handling device (not shown) so that the article 11 is disposed beneath the opening 18, the valves 24–27 are positioned as shown in FIG. 1. That is, the valves 24 and 26 are in a closed position while the valves 25 and 27 are in an open position. At this time, the gates 33 and 35 are in a blocking position while the gates 32 and 32 are in an open position. Furthermore, air is being supplied through the openings 40 and 42 from the source 45.

Accordingly, the duct 10 is divided into a first segment between the inlet end of the duct 10 and the gate 33, a second segment between the gate 33 and the gate 35, and a third segment between the gate 35 and a blocked exit end of the duct 10. Thus, the first segment includes the stations, which are at the openings 18 and 19, the second segment includes the station, which are at the openings 20 and 21, and the third segment includes the station, which is at opening 22.

Accordingly, with the opening 19 open and the opening 18 closed and air being introduced into the duct 10 through the opening 40, a pressure differential is attained and a flow of air is created form the blocked inlet end of the duct 10 to the opening 19. That is, the pressure is maximum adjacent to the inlet end of the duct 10 and is zero at the opening 19 since the air escapes therethrough. Thus, constant differential pressure is maintained between the opening 18, which is the station at which the article 11 is disposed, and the opening 19, which is the station to which the article is to be advanced by the differential pressure and resultant air flow.

The differential pressure profile between the blocked inlet end of the duct 10 and opening 19 is indicated by phantom lines and identified by 46. In the segment between the blocked inlet end of the duct 10 and the gate 33, a second differential pressure profile 47, which is shown in phantom lines, is formed between the opening 19 and the gate 33. The second differential pressure profile 47 is due to air flowing through the bottom wall 12. Thus, the pressure decreases from the gate 33 to the opening 19 but the maximum at the gate 33 is less than at the blocked inlet end of duct 10. Accordingly, the article 11 may be advanced from station, which is at the opening 18, to the station, which is at the opening 19.

At the same time that the article 11 is being advanced from opening 18 to the opening 19, second of the articles 11 is being advanced from the station, which is at the opening 20, to the next adjacent station, which is at the opening 21. This is accomplished through the same type of differential pressure profiles, which are indicated in phantom lines and identified by 48 and 49, as existed at 46 and 47, respectively, in the segment between the gate 33 and the blocked inlet end of the duct 10. The profiles 48 and 49 are formed within the segment between the gates 33 and 35.

At the same time that the second of the articles 11 is being advanced from the station, which is at the opening 20, to the station, which is at the opening 21, one of the articles 11 is removed from the opening 22 of the duct 10. The gate 35 has blocked the station, which is at the opening 22, from communication with any of the other stations. Therefore, at this time, removal of the article 11 is easily accomplished through the opening 22 by suitable means. The differential pressure profile in this segment is due to the air flowing through the bottom wall 12.

After the articles 11 have been advanced to the stations, which are at the openings 19 and 21, the gates 33 and 35 are moved to a raised or unblocking position while the gates 32 and 34 are lowered to a blocking position as shown in FIG. 2. Simultaneously, the valves 24 and 26 are lifted to an open position while the valves 25 and 27 are moved downwardly to a closed position as shown in FIG. 2. Likewise, air is simultaneously supplied only through the openings 41 and 43.

With this arrangement of the valves and gates, the duct 10 is divided into a first segment between the gate 32 and the blocked inlet end of the duct 10, a second segment between the gates 32 and 34, and a third segment between the gate 34 and the blocked exit end of the duct 10. The differential pressure profiles within the duct 10 at this time are indicated by phantom lines in the same manner as in FIG. 1. However, they are not identified by numerals. It should be understood hat the differential pressure profile between the gate 32 and the opening 18 is due to air flowing through the bottom all 12.

The differential pressure within the second segment, which is formed between the gates 32 and 34, advances the article 11 from the station, which is at the opening 19, to the station, which is at the opening 20. Likewise, the second of the articles 11, which is disposed at the station at the 21, is advanced to the station, which is at the opening 22. This is due to the differential pressure profile and resultant air flow in the third segment of the duct 10 between the blocking gate 34 and the opening 22. At the time that the valves and gates are arranged in the position shown in FIG. 2, one of the articles 11 may be disposed within the duct 10 at the station, which is at the opening 18, through the opening 18 in the upper wall 23 of the duct 10. Accordingly, when the articles 11 have been advanced to the stations at the openings 20 and 22 from the stations at the openings 19 and 21, the positions of the valves and the gates are returned to that of FIG. 1. This arrangement is shown in FIG. 3.

Thus, the process is again repeated to advance the new article 11 from the station, which is at the opening 18, to the station, which is at the opening 19. The article 11, which is now at the station at the opening 20 after being advanced from the station at the opening 18 through FIGS. 1 and 2, is now advanced to the station, which is at the opening 21. The article 11, which was at the station at the opening 20 in FIG. 1 is now at the station, which is at the opening 22. Thus, the article 11, which is at the opening 22, is now removed since the gate 35 is blocking the opening 22 from the remainder of the duct 10.

By appropriately controlling the differential pressure profiles, the acceleration may be varied as desired. Furthermore, this permits control of the velocity of the article 11.

If desired, a vacuum brake may be located adjacent each of the stations to prevent any overtravel of the article 11 that might occur. Thus, even though the opening, which does not have its valve closing it, is the point of zero pressure in the differential pressure profiles within the segment of the duct 10, the possibility exists that the article 11 might slightly overtravel the opening. Of course, it would eventually settle at the opening but this would increase the time required to advance the article 11 from one end of the duct 10 to the other end of the duct 10.

The vacuum brake employs a hose (one shown at 50 in FIG. 4 for the opening 20) communicating with the duct 10 at each of the openings 19–22. Each of the hoses is connected to a vacuum pump 51. A valve (one shown at 52 for the hose 50 to the duct 10 adjacent the opening 20) is arranged between each of the hoses and the vacuum pump 51 to control the connection of the vacuum pump 51 to each of the hoses. The valves are normally closed; each valve is opened only when one of the articles 11 approaches the opening to which the hose is disposed adjacent. Thus, the vacuum brake is applied only as the article 11 approaches the station. The duct 10 may have photocells (one shown at 53 adjacent the opening 20) adjacent each of the stations at the openings 19–22. Each of the photocells is blocked from its source of light when the article 11 passes through the duct 10 to control the valve, which connects the vacuum pump 51 to the hose that is adjacent the station that the article 11 is approaching.

Because the photocell is activated only for a very short period of time, the vacuum brake is effective for only a short period of time. Thus, the photocell must be positioned so that the vacuum brake becomes effective when the article 11 arrives adjacent to the end of the hose. As soon as the article 11 passes the photocell, the valve again blocks the hose from the vacuum pump 51 so that the vacuum brake is again disconnected. The counterflow within the segment of the duct 10 will maintain the article 11 at the station, which is at the opening, after the vacuum brake is no longer effective.

While two sources of air have been utilized with one of the sources being employed to produce an air film to suspend the articles 11 within the duct 10 while the other source is utilized to supply the air to aid the pressure differentials within the segments of the duct 10, is should be understood that only the source of air for supplying the air film could be employed if desired. However, this would substantially increase the time required to move the article 11 between stations.

For automatic operation of the valves 24–27 between open and closed positions and the gates 32–35 between blocking and unblocking positions, it is necessary to control the solenoid valve 31′, which regulates the flow of air to the air cylinders 30 and 37. It also is necessary to control the solenoid valve 44 to regulate the flow of air to the openings 40–43.

Photocells (one shown at 54 in FIG. 4) may be employed at each of the stations to sense when the articles have arrived at the stations. Of course, this would require a circuit control arrangement in which the appropriate photocells would be utilize to control the solenoid valves 31′ and 44 since the articles 11 are not at each of the stations at the end of each cycle of movement but at only alternate stations. Instead of utilizing the photocells, any other suitable means could be employed such as timers since the rate of movement of the articles 11 from one station to the next adjacent station could readily be determined.

It should be understood that the articles 11 cannot exit through the openings 18–22 when the openings 18–22 are open because of the flow regulation of the air through the duct 10. Thus, the openings 18–22 may be made as large or larger than the articles 11 without the problem of the articles 11 escaping from the duct 10.

Figure 4:
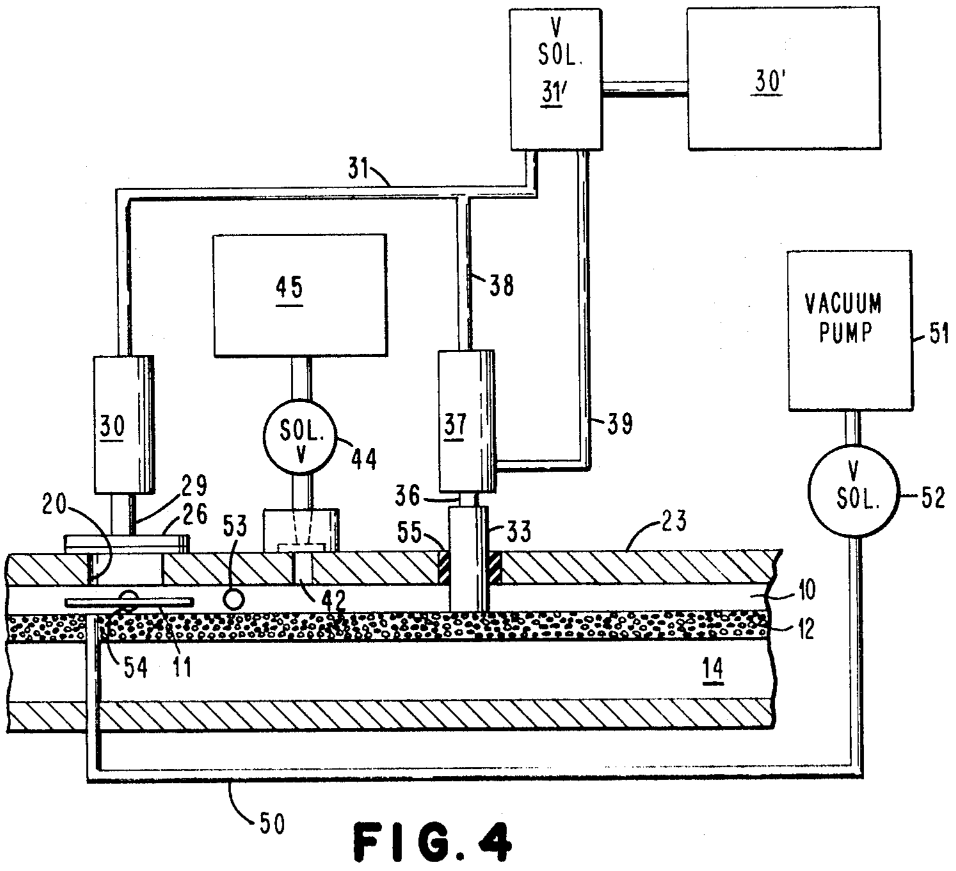
FIG. 4 is a schematic side sectional view showing a portion of the transport system including a vacuum brake.
Figure 5:
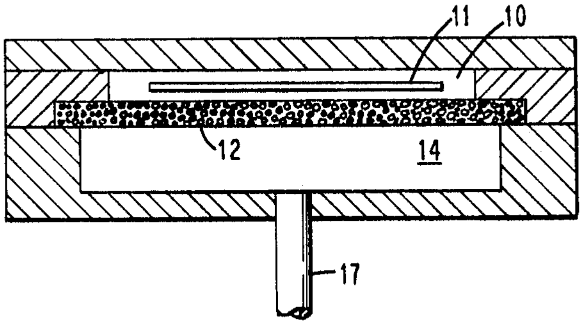
FIG. 5 is a sectional view of the transport system of FIGS. 1–3.

Each of the gates 32–35 passes through the upper wall 23 of the duct 10 by means of a bushing 55 (see FIG. 4). This permits a rather tight seal with the gate.

While only five of the stations have been shown, it should be understood that the duct 10 may have any number of stations. While the articles have been shown and described as being inserted into and removed from the duct 10 through the openings 18 and 22, respectively, it should be understood that separate openings in the sidewall of the duct 10 could be employed, if desired, to insert and remove the articles 11.

An advantage of this invention is that the articles do not touch each other or the duct during movement through the duct. Another advantage of this invention is that positive control of the position of each article is obtained. A further advantage of this invention is that there is no overtravel of the articles beyond each station to which the article is being advanced. Still another advantage of this invention is that damage to the articles is prevented.

While the invention has been particularly shown and described with reference to a preferred embodiment thereof, it will be understood by those skilled in the art that various changes in form and details may be made therein without departing from the spirit and scope of the invention.

We claim:

1. A transport system for an article comprising:
an enclosed duct to receive the article for transport therethrough through advancement to a plurality of spaced stations in said duct in sequence;
means to produce a substantially continuously decreasing pressure from a high at one station at which the article is located to a low at the next adjacent station to which the article is to be advanced to control the movement of the article from the one station to the next adjacent station;
said duct having a cross-sectional area substantially larger than the article so that the decreasing pressure between the stations is not affected by the presence of the article as the article is advanced by said producing means from the one station to the next adjacent station;
braking means to stop the article at the next adjacent station to prevent overtravel of the article beyond the next adjacent station;
and said producing means including means to change the pressure differential between adjacent stations only when the article is at the next adjacent station to cause the pressure at the next adjacent station to be a high and the pressure at the next further adjacent station to be a low to control the movement of the article from the next adjacent station to the next further adjacent station.

2. The system according to claim 1 in which said braking means comprise means to apply a vacuum.

3. A transport system for an article comprising:
an enlcosed duct to receive the article for transport therethrough through advancement to a plurality of stations in said duct in sequence;
means to control the movement of the article from one station to the next adjacent station by maintaining a substantially constantly decreasing pressure from a high at the one station to a low at the next adjacent station;
means to supply a gas to said duct to suspend the article within said duct;
said control means including means to change the pressure differentials between adjacent stations upon completion of movement of the article between adjacent stations;
said duct has an opening at each of the stations including the exit station;
and said control means includes:
valve means to open and close each of said openings except said opening at the exit station;
gate means between each adjacent pair of said openings and adjacent one of said openings to block said duct;
and means to position each of said valve means and each of said gate means to cause a decreasing pressure from the one station to the next adjacent station in the direction of movement of the article and an increasing pressure from the next adjacent station toward the station next to the next adjacent station when the article to be advanced from the one station to the next adjacent station.

4. The system according to claim 3 including means to introduce a gas into said duct adjacent each of said valve means.

5. A gaseous transport system for an article comprising:
an enclosed duct to receive the article for transport therethrough through advancement to a plurality of spaced stations in said duct in sequence;
means to introduce a first stream of a gas into said duct to suspend the article to be transported within said duct;
means to introduce a second stream of gas into said duct;
means to control the pressure of the second stream of gas within said duct to advance the article from one station to the next adjacent station;
said control means producing nonchanging pressure differential between the one station and the next adjacent station with a high at the one station and a low at the next adjacent station during the advancement of the article from the one station to the next adjacent station;
said control means including means to change the pressure differential between adjacent stations only when the article is at the next adjacent station to cause the pressure at the next adjacent station to be a high and the pressure at the next further adjacent station to be a low to control the movement of the article from the next adjacent station to the next further adjacent station;
and said duct having a cross-sectional area substantially larger than the article so that the pressure of the second stream of gas within said duct between the stations is not affected by the presence of the article as the article is advanced from the one station to the next adjacent station by the pressure of the second stream of gas.

6. The system according to claim 5 in which:

said control means includes means movable into and out of said duct to divide said duct into a plurality of segments in accordance with the positions of the article in said duct;

each of said segments including the one station at which the article is disposed and the next adjacent station to which the article is to be advanced;

said second stream introducing means supplying the gas to each of said segments;

and means to regulate the pressure differential of the second stream of gas within each of said segments.

7. The system according to claim 8 in which said regulating means produces a decreasing pressure from the one station to the next adjacent station.

8. A method of transporting an article from one end of an enclosed duct to the other comprising:

disposing the article in one end of the duct;

supplying a first stream of a gas to the duct to continuously and freely suspend the article within the duct;

supplying a second stream of a gas to the duct separate from the first stream of gas;

controlling the pressure of the second stream of the gas at each of a plurality of stations between the ends of the duct to advance the article from each station to the next adjacent station by maintaining a pressure differential therebetween with a high at the station at which the article is disposed and a low at the next adjacent station to which the article is to be advanced;

and applying the pressure differential only between the station at which the article is disposed and the next adjacent station to which the article is to be supplied during advancement of the article between the two stations.

9. The method according to claim 8 in which a plurality of articles is transported form one end of the enclosed duct to the other in a separate spaced arrangement comprising:

disposing each of the articles in the one end of the duct at selected staggered intervals;

controlling pressure of the second stream of the gas at each of a plurality of the spaced stations between the ends of the duct to advance each of the articles separately from each station to the next adjacent station by maintaining the pressure differential therebetween;

and selecting the staggered intervals at for articles are disposed in the one end of the duct so that each of the articles is spaced two stations from the next adjacent article during transport through the duct.

10 A gaseous transport system for an article comprising:

an enclosed duct;

means to introduce a first stream of a gas into said duct to suspend the article to be transported within said duct;

means to introduce a second stream of gas into said duct;

means to control the pressure of the second stream of gas within said duct to advance each of the articles form one station to the next adjacent station;

said control means includes means to divide said duct into a plurality of segments;

each of said segments including the one station at which one of the articles is disposed and the next adjacent station to which the one article to be advanced;

said second stream-introducing means supplying the gas to each of said segments;

means to regulate the pressure differential of the second stream of gas within each of said segments;

each of said segments has at least one opening in said duct;

and said regulating means includes valve means cooperating with said opening to open or close said opening to produce the desired pressure differential in said segment.

11. A gaseous transport system for an article comprising:

an enclosed duct to receive the article for transport therethrough from a first station to a second station;

first means to introduce a first stream of gas to suspend the article to be transported within said duct;

second means to introduce a second stream of gas, separate from the first stream of gas, into said duct to produce a pressure differential between the first station and the second station with a high at the first station and a low at the second station during the advancement of the article from the first station to the second station;

and said duct having a cross-sectional area substantially larger than the article so that the pressure differential between the stations is not affected by the presence of the article as the article is advanced form the first station to the second station.

12. A method for transporting an article sequentially to a plurality of spaced stations comprising:

applying a substantially continuously decreasing pressure from a high at a first station to a low at the next adjacent station to advance the article from the first station to the next adjacent station;

stopping the application of the decreasing pressure when the article is at the next adjacent station;

preventing communication between the first station and the next adjacent station while applying a substantially continuously decreasing pressure from a high at the next adjacent station to a low at the next station in the direction of movement of the article;

and stopping the application of the decreasing pressure when the article is at the next station in direction of movement.

13. The method according to claim 12 in which a plurality of articles is sequentially advanced between a plurality of spaced stations including:

selecting the introduction intervals for the articles at an entrance station so that each of the articles is spaced two stations from the previously introduced article;

applying a substantially continuously decreasing pressure between adjacent stations where one of the stations has one of the articles thereat for advancement to the other of the stations with a high at the station having the article and a low at the station to which the article is to be advanced;

and stopping the application of the substantially continuously decreasing pressure between the adjacent stations when the article is at the station to which it is to be advanced by the decreasing pressure.

14. A method of transporting an article through an enclosed duct from a first station to a second station in which the duct is substantially larger than the article so that the article does not affect any pressure differential between the stations comprising:

disposing the article at the first station;

supplying a first stream of gas to the duct to continuously and freely suspend the article within the duct;

supplying a second stream of gas, separate from the first stream of gas, to the duct;

and controlling the pressure of the second stream of gas to produce a pressure differential between the first and second stations with a high at the first station and a low at the second station during the advancement of the article from the first station to the second station.

15. A transport system for an article comprising:

an enclosed duct to receive the article for transport therethrough through advancement to a plurality of spaced stations in said duct in sequence;

means to produce a substantially continuously decreasing pressure from a high at one station at which the article is located to a low at the next adjacent station to which the article is to be advanced to control the movement of the article from the one station to the next adjacent station:

said duct having a cross-sectional area substantially larger than the article so that the decreasing pressure between the stations is not affected by the presence of the article as the article is advanced by said producing means from the one station to the next adjacent station;

said producing means including means to change the pressure differential between adjacent stations only when the article is at the next adjacent station to cause the pressure at the next adjacent station to be a high and the pressure at the next further adjacent station to be a low to control the movement of the article from the next adjacent station to the next further adjacent station:

means to supply a gas to said duct to produce a gas film therein to freely suspend the article with said duct;

and said supply means and said producing means being separate from each other.